United States Patent
Choi

(10) Patent No.: US 7,705,407 B2
(45) Date of Patent: Apr. 27, 2010

(54) HIGH VOLTAGE SEMICONDUTOR TRANSISTOR DEVICE HAVING SMALL SIZE AND LONG ELECTRON FLOW PATH

(75) Inventor: Yong Keon Choi, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 519 days.

(21) Appl. No.: 11/617,290

(22) Filed: Dec. 28, 2006

(65) Prior Publication Data

US 2007/0155143 A1    Jul. 5, 2007

(30) Foreign Application Priority Data

Dec. 29, 2005   (KR) .................. 10-2005-0133429

(51) Int. Cl.
*H01L 31/119* (2006.01)
(52) U.S. Cl. .................. 257/396; 257/336; 257/344; 257/E21.205
(58) Field of Classification Search ......... 257/334–344, 257/396–399, E21.205
See application file for complete search history.

(56) References Cited

FOREIGN PATENT DOCUMENTS

| KR | 1019960013947 B1 | 10/1996 |
| KR | 1020050019390 A | 3/2005 |

*Primary Examiner*—Dung A. Le
(74) *Attorney, Agent, or Firm*—Sherr & Vaughn, PLLC

(57) ABSTRACT

Embodiments relate to a high voltage semiconductor device. The device includes a substrate having impurities of a first conductivity and having a first surface and a second surface, a gate electrode over the first surface, an LDD region having low concentration impurities of a second conductivity doped in the substrate at a first side of the gate electrode, a drain region having high concentration impurities of the second conductivity doped in the LDD region, a source region having high concentration impurities of the second conductivity doped in the substrate at a second side of the gate electrode, and spacers formed at sidewalls of the gate electrode. The first surface is higher than the second surface, and the source and LDD regions are at least partially formed in a region at the second surface. A bottom side of one of the spacers directly contacts the LLD region.

13 Claims, 3 Drawing Sheets

HIGH VOLTAGE SEMICONDUTOR TRANSISTOR DEVICE HAVING SMALL SIZE AND LONG ELECTRON FLOW PATH

The present application claims priority under 35 U.S.C. 119 and 35 U.S.C. 365 to Korean Patent Application No. 10-2005-0133429 (filed on Dec. 29, 2005), which is hereby incorporated by reference in its entirety.

BACKGROUND

In general, a high voltage semiconductor transistor device may one type of a power transistor, and may be used for a drive IC of a display device, servo motor, and/or an actuator requiring a high voltage operation.

Such a high voltage semiconductor transistor device may require a high breakdown voltage, and may use a lateral diffused MOS (LDMOS) or a lightly doped drain (LDD) structure.

FIG. 1 is an example cross-sectional diagram illustrating a related art semiconductor transistor device. The example semiconductor transistor of FIG. 1 is illustrated with an LDD structure.

Referring to FIG. 1, LDD region 12 may be formed at one side of P-type substrate 11, and may be made of silicon Si to a prescribed depth by a low concentration $N^-$ doping.

Further, drain and source regions 13 and 14 may be formed at LDD region 12 and another side of P-type substrate 11 to have a prescribed depth from a surface.

Gate poly layer 16 may be insulated from drain and source regions 13 and 14 through gate oxide layer 15.

Drain electrode D, source electrode S, and gate electrode G may be formed at drain region 13, source region 13, and gate poly layer 16, respectively.

As described above, in a related art design of a high voltage semiconductor transistor device, it may be important to obtain a high breakdown voltage.

To obtain a high breakdown voltage, an interval between an edge of gate poly layer 16 and drain region 13 may be adjusted. Namely, the high breakdown voltage may be obtained by adjusting a length expressed as "DR" in FIG. 1.

In FIG. 1, F may represent a generation position of a high voltage electric field, and an arrow may represent an electron flow path of a channel layer formed when applying a power source to gate electrode G.

To obtain the high breakdown voltage, "DR" may be increased. However, if "DR" is increased, a size of a transistor may also be increased.

Moreover, in a structure in which an electric current flows to a surface of LDD region 12, as the time of use of a device increases, a breakdown voltage may change.

SUMMARY

Embodiments relate to a high voltage semiconductor transistor device and a method for manufacturing a semiconductor device. Embodiments relate to a high voltage semiconductor transistor device that may be capable of improving high voltage characteristics by extending spacers formed at a side of a gate to a semiconductor substrate on which a source and a drain may be formed, and a method for manufacturing a semiconductor device.

Embodiments relate to a high voltage semiconductor transistor device, which may have a smaller design size with the same breakdown voltage and may solve a change of the breakdown voltage, without additional masks or processes, and a method for manufacturing the same.

In embodiments, a semiconductor transistor device may include a substrate made of impurities of a first conductivity, an LDD region made of low concentration impurities of a second conductivity doped in the substrate to reach a prescribed depth from one surface of the substrate, a drain region made of high concentration impurities of the second conductivity doped in the LDD region to reach a prescribed depth from a surface of the LDD region, a source region made of high concentration impurities of the second conductivity doped in the substrate to reach a prescribed depth from another surface of the substrate, a gate poly layer formed on a center surface of the substrate via a gate oxide layer, wherein upper portions of the source and drain regions are positioned lower than the surface of the substrate, which may be positioned at a lower portion of the gate oxide layer.

In embodiments, the first conductivity may be P-type and the second conductivity may be N-type.

In embodiments, spacers may be formed at sidewalls of the gate oxide layer and the gate poly layer, respectively.

In embodiments, a lower portion of each of the spacers may extend from the substrate on which the gate oxide layer may be deposited to a lower direction.

In embodiments, the lower portion of the spacer may contact the source region and one side of the LDD region.

In embodiments a method for manufacturing a semiconductor transistor device may include (i) forming an LDD region at an upper right side of a substrate made of impurities of a first conductivity with a low concentration doping, (ii) sequentially laminating a gate oxide layer and a gate poly layer at an entire surface of the substrate, (iii) etching the gate poly layer using a mask for patterning a gate electrode, (iv) etching the gate oxide layer, the substrate under the gate oxide layer, or the LDD region to a prescribed depth using the gat poly layer remained after the etch of step (iii), and (v) performing a high concentration doping for the LDD region and the substrate to form a drain region and a source region, and forming spacer layers for enclosing left and right sidewalls of the gate oxide layer and the gate poly layer.

DETAILED DESCRIPTION OF EMBODIMENTS

Figure 1:
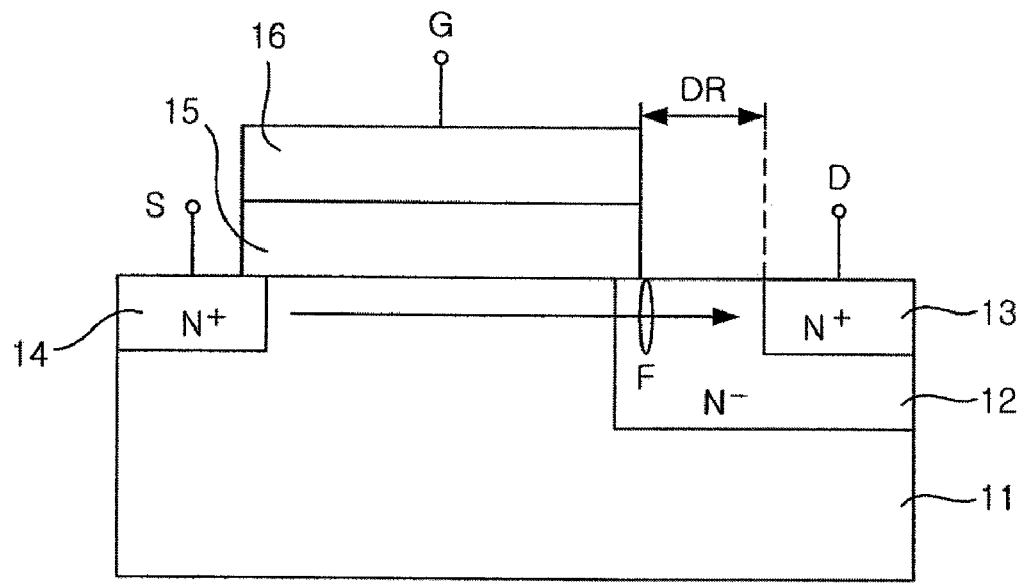
FIG. 1 is an example cross-sectional diagram illustrating a related art semiconductor transistor device.
Figure 2:
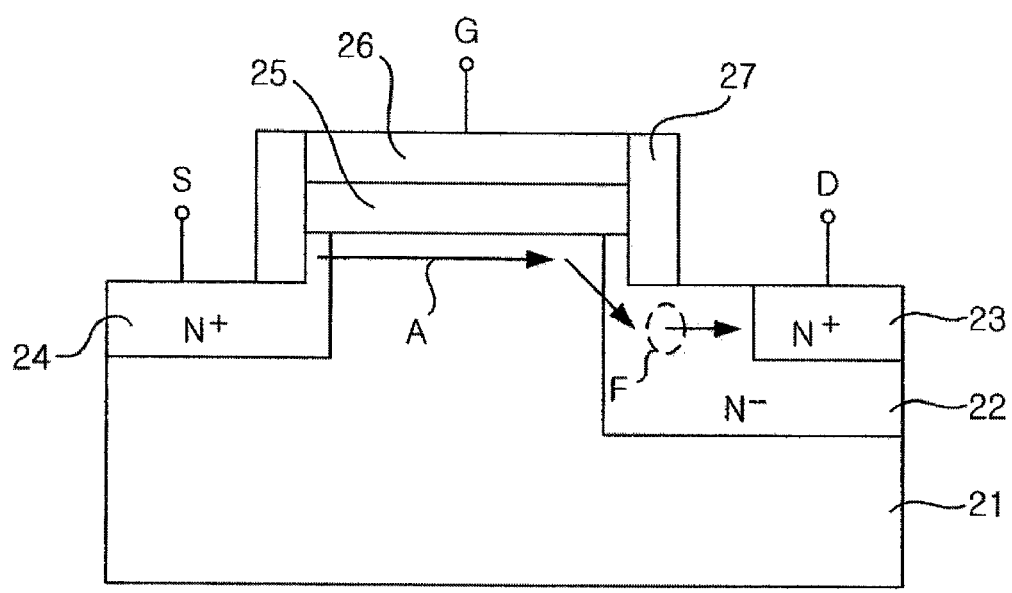
FIG. 2 is an example cross-sectional diagram illustrating a transistor device according to embodiments.

FIG. 2 is an example cross-sectional diagram illustrating a transistor device according to embodiments. FIGS. 3A to 3D are example cross-sectional diagrams illustrating a transistor and a method for manufacturing a transistor device according to embodiments. For convenience, embodiments may be described referring to transistor device that may be an NMOS transistor, a substrate of which may be a P-type. However, embodiments are not limited to such a configuration. For example, a PMOS transistor may be provided.

Referring to FIG. 2, P-type substrate 21 may be provided and may be made of P-type impurities such as silicon.

As shown, LDD region 22 may be formed on a right side of P-type substrate 21 and may reach a prescribed depth from a surface of P-type substrate 21 by a low concentration $N^-$ doping.

Furthermore, a high concentration drain region 23 may be formed at a right surface of LDD region 22, for example by a high concentration impurity $N^+$ doping.

In embodiments, a vertical position in the upper most surface of P-type substrate 21 may be formed to be different from that of a surface of drain region 23. Hence, a step may exist such that portion of the substrate 21 is raised above the portion where drain region 23 is formed.

High concentration source region 24 may be formed at a left side of P-type substrate 21 and may reach a prescribed depth from a surface of P-type substrate 21 by a high concentration N+ doping.

Gate oxide layer 25 may be formed at a center surface of P-type substrate 21, and gate poly layer 26 may be formed thereon. In embodiments, gate oxide layer 25 may be formed on the step portion of the substrate 21 that is raised above the portion where drain region 23 is formed.

Drain electrode D, source electrode S, and gate electrode G may be formed on drain region 23, source region 24, and gate poly layer 26, respectively.

Spacer layers 27 may be formed at left and right sidewalls of gate oxide layer 25 and gate poly layer 26. In embodiments, space layers 27 may not be on the raised portion of the substrate, but may instead be formed on a surface having a height of a surface of the drain region 23. Space layers 27, however, may be formed to a top surface of gate 26.

In embodiments, if a power source is applied to the gate electrode G, a channel layer may be formed from source region 24 to drain region 23.

For example, as shown by arrow A in FIG. 2, the channel layer may be formed from a surface of source region 24 to a surface of drain region 23.

A vertical position in the upper most surface of P-type substrate 21 (for example, lower portion of gate oxide layer 25) may be formed to be different from that of a surface of drain region 23.

Because of this step in the surface of the substrate 21, as shown in FIG. 2, the channel layer may be formed to be bent. That is, the channel may not be of uniform linearity, and may bend according to a contour of the surface of the substrate 21.

Hence, in embodiments, a distance between an edge of gate poly layer 26 and drain region 23 to secure a current flow path of the same length may be reduced in comparison with the transistor device according to the related art.

In embodiments, a transistor device may have a the relatively small device size.

Furthermore, in embodiments, because an electric field generation region of a high voltage may change due to a bending of the current flow path, a breakdown voltage may be stably maintained. That is, a fluctuation of the breakdown voltage may be reduced.

Hereinafter, a method for manufacturing a semiconductor device according to embodiments will be described with reference to FIGS. 3A to 3D.

Figure 3A:
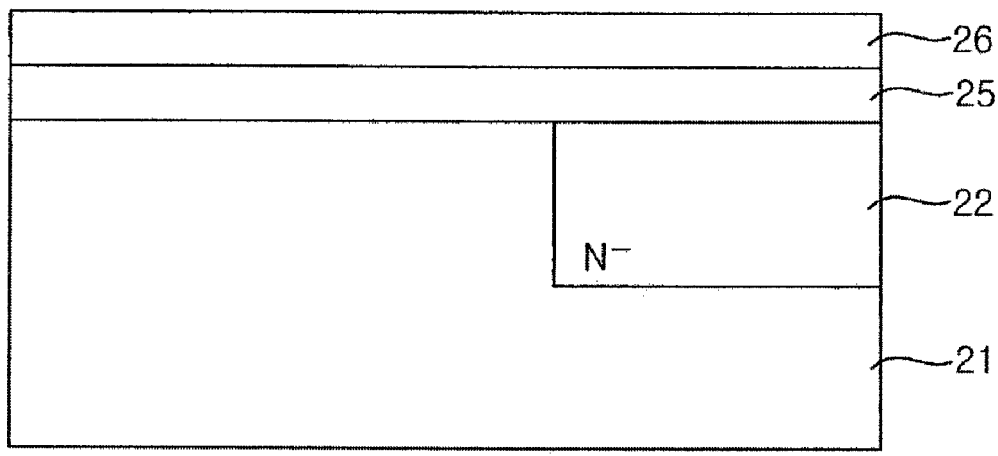
FIGS. 3A to 3D are example cross-sectional diagrams illustrating a transistor and a method for manufacturing a transistor device according to embodiments.

Referring to FIG. 3A, P-type substrate 21 made of P-type impurities may be prepared, and LDD region 22 may be formed to a prescribed depth at an upper side (for example, the right side) of P-type substrate 21, for example by a low concentration doping.

Gate oxide layer 25 and gate poly layer 26 may be sequentially laminated on a surface of P-type substrate 21.

Figure 3B:
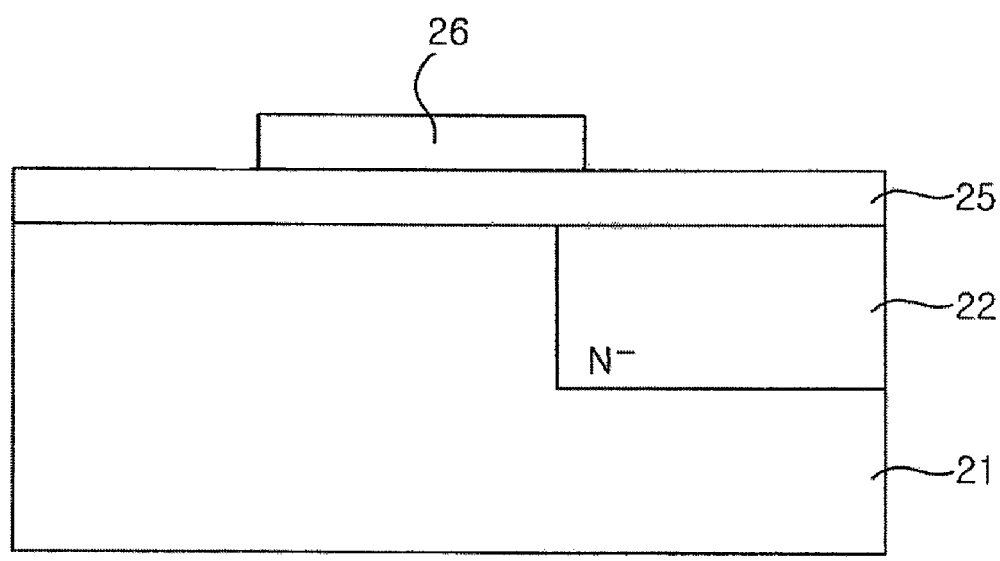

Referring to FIG. 3B, gate poly layer 26 may be etched using a mask for patterning the gate electrode.

Figure 3C:
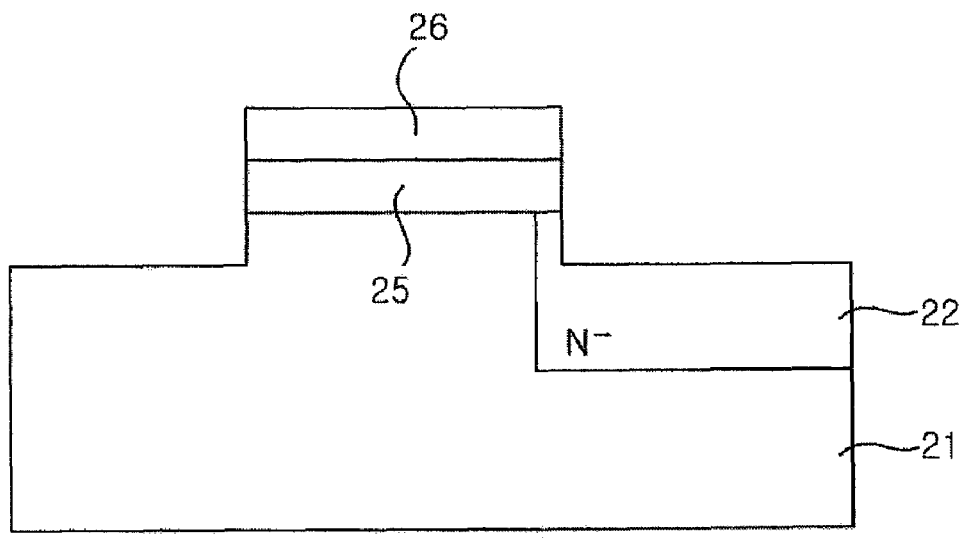

Referring to FIG. 3C, gate oxide layer 25, P-type substrate 21 disposed at a lower portion thereof, and a part of LDD region 22 may be etched using the remaining gate poly layer 26 as a mask.

In embodiments, an upper portion of the P-type substrate may be etched to a prescribed depth. An upper portion of the P-type substrate may be positioned at a side (for example the right side) of gate oxide layer 25 next to which a source region will be formed. Further, an upper portion of LDD region 22 may be etched to a prescribed depth. In embodiments, gate oxide layer 25 may be formed may be positioned at a left side of LDD region 22. A drain region may be formed in the substrate 21 adjacent to the stepped region were gate oxide layer 25 is formed.

Figure 3D:
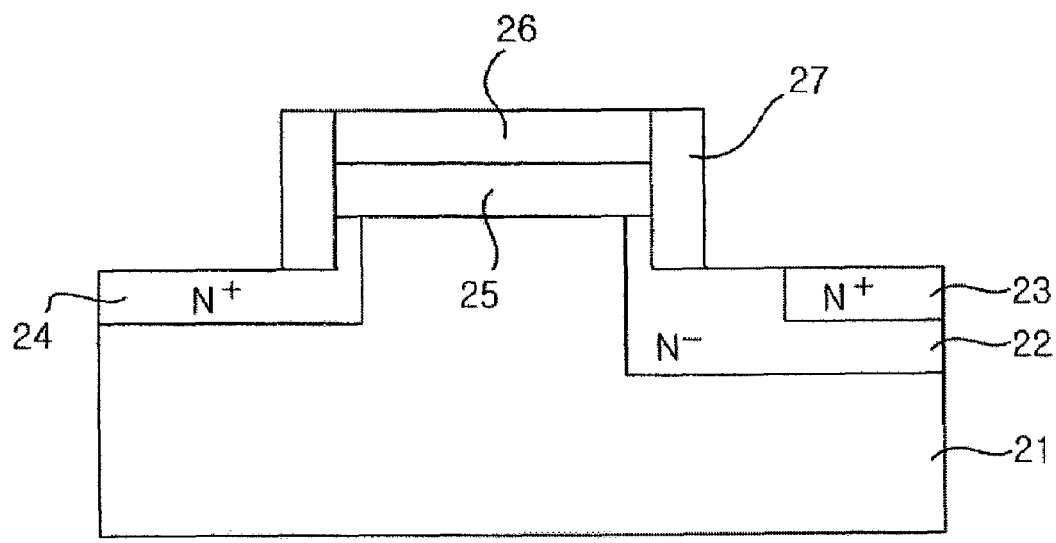

Referring to FIG. 3D, spacer layers 27 may be formed to enclose left and right sidewalls of gate oxide layer 25 and gate poly layer 26.

A high concentration N+ doping may be performed for LDD region 22 and P-type substrate 21, and may form drain region 23 and source region 24.

According to embodiments, an upper surface of the semiconductor substrate may be partially etched to form source region 24 and drain region 23.

According to embodiments, spacer layers 27 enclosing left and right sidewalls of the gate oxide layer and gate poly layer 26 may be formed to extend to the semiconductor substrate.

Accordingly, a current flow path between the source electrode and the drain electrode may not be linear, but may instead have a bent shape.

According to embodiments, when forming a transistor device, amplitude of an electric field produced between the gate region and the drain region may be reduced. Accordingly, the transistor device of the present invention may have improved high voltage characteristics.

According to embodiments, when using a transistor device, an etch depth of the source region and the drain region can be adjusted.

As a result, a current flow path and a high voltage generation region may be controlled, according to embodiments.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a substrate comprising impurities of a first conductivity, the substrate having a first surface and a second surface;
   a gate electrode formed over the first surface of the substrate;
   an lightly doped drain (LDD) region comprising low concentration impurities of a second conductivity doped in the substrate at a first side of the gate electrode;
   a drain region comprising high concentration impurities of the second conductivity doped in the LDD region; and
   a source region comprising high concentration impurities of the second conductivity doped in the substrate at a second side of the gate electrode; and
   spacers formed at sidewalls of the gate electrode, wherein one of the spacers includes a bottom surface contacting the LDD region,
   wherein the first surface of the substrate has a height that is greater than a height of the second surface of the substrate, and wherein the source and LDD regions are at least partially formed in a region at the second surface.

2. The device of claim 1, wherein the source and at least a portion of the drain are positioned lower than the gate electrode.

3. The device of claim 1, wherein the LDD region is formed to reach a first depth below the second surface of the substrate, and the drain and source regions are formed to reach a second depth below the second surface of the substrate, the first depth being greater than the second depth.

4. The device of claim 1, wherein the gate electrode comprises a gate oxide layer formed over the first surface of the substrate and a gate poly layer formed over the gate oxide layer.

5. The device of claim 1, wherein a portion of the LDD region is formed within the substrate at a region of the first surface.

6. The device of claim 5, wherein a portion of the high concentration impurities forming the source are provided in the first surface of the substrate.

7. The device of claim 1, wherein the first conductivity is P-type and the second conductivity is N-type.

8. The device of claim 1, wherein the spacers are formed over the second surface of the substrate, and on side surfaces of the first surface of the substrate.

9. The device of claim 1, wherein a lower portion of each of the spacers extends from the a side of the substrate on which the gate electrode is formed to a lower direction toward the second surface of the substrate.

10. The device of claim 9, wherein the lower portion of the spacer contacts the substrate over the source region and over the LDD region, respectively.

11. A device comprising:
    a semiconductor substrate having a first surface and a second surface, the second surface being at a greater height than the first surface;
    a gate electrode being formed over the second surface;
    a lightly doped drain (LDD) region formed at a first side of the gate electrode to a first depth within the semiconductor substrate, a portion of the LDD region being formed in a region under the second surface and a portion being formed in a region under the first surface;
    a drain formed within the LDD region;
    a source formed in the semiconductor substrate to a second side of the gate electrode;
    sidewalls formed at sides of the gate electrode over the first surface of the semiconductor substrate; and
    spacers formed at the sidewalls, wherein one of the spacers includes a bottom surface contacting the LDD region.

12. The device of a claim 11, wherein the gate electrode comprises gate oxide layer formed on the second surface of the semiconductor substrate and a gate poly layer formed over the gate oxide layer.

13. The device of a claim 11, wherein a portion of the source is formed under the second surface of the substrate by implanting high concentration impurities having a conductivity different from a conductivity if the semiconductor substrate.

* * * * *